(12) United States Patent
Huang et al.

(10) Patent No.: US 12,274,069 B2
(45) Date of Patent: Apr. 8, 2025

(54) SEMICONDUCTOR DEVICE HAVING FERROELECTRIC LAYER IN RECESS AND METHOD FOR MANUFACTURING THE SAME

(71) Applicants: BEIJING SUPERSTRING ACADEMY OF MEMORY TECHNOLOGY, Beijing (CN); INSTITUTE OF MICROELECTRONICS, CHINESE ACADEMY OF SCIENCES, Beijing (CN)

(72) Inventors: Weixing Huang, Beijing (CN); Huilong Zhu, Beijing (CN)

(73) Assignees: BEIJING SUPERSTRING ACADEMY OF MEMORY TECHNOLOGY, Beijing (CN); INSTITUTE OF MICROELECTRONICS, CHINESE ACADEMY OF SCIENCES, Beijing (CN)

( * ) Notice: Subject to any disclaimer, the term of this patent is extended or adjusted under 35 U.S.C. 154(b) by 0 days.

(21) Appl. No.: 17/783,627

(22) PCT Filed: Dec. 23, 2021

(86) PCT No.: PCT/CN2021/140813
§ 371 (c)(1),
(2) Date: Jun. 8, 2022

(87) PCT Pub. No.: WO2023/108785
PCT Pub. Date: Jun. 22, 2023

(65) Prior Publication Data
US 2024/0164110 A1    May 16, 2024

(30) Foreign Application Priority Data

Dec. 15, 2021 (CN) .......................... 202111535097.2

(51) Int. Cl.
*H10B 51/30* (2023.01)
*H10B 51/10* (2023.01)
*H10B 51/20* (2023.01)

(52) U.S. Cl.
CPC ............. *H10B 51/30* (2023.02); *H10B 51/10* (2023.02); *H10B 51/20* (2023.02)

(58) Field of Classification Search
CPC ......... H10B 51/10; H10B 51/20; H10B 51/30
See application file for complete search history.

(56) References Cited

U.S. PATENT DOCUMENTS

2021/0036019 A1    2/2021 Sharangpani et al.
2021/0104523 A1*   4/2021 Fulford ................. H01L 29/775
(Continued)

FOREIGN PATENT DOCUMENTS

CN    106298792 A  *  1/2017 .......... H01L 27/1159
CN    113178455 A     7/2021
(Continued)

OTHER PUBLICATIONS

ISA State Intellectual Property Office of the People's Republic of China, International Search Report and Written Opinion Issued in Application No. PCT/CN2021/140813, Sep. 15, 2022, WIPO, 11 pages.

*Primary Examiner* — Matthew E Warren
(74) *Attorney, Agent, or Firm* — Kilpatrick Townsend & Stockton LLP

(57) ABSTRACT

A semiconductor device, including a substrate, a first electrode layer, a functional layer, and a second electrode layer. The functional layer is located between the first electrode layer and the second electrode layer, and includes a first region and a second region having a C-shaped structure surrounding the first region. The C-shape structure opens toward a direction that is parallel with the substrate and away from the first region, that is, the C-shaped structure (Continued)

opens toward a distal side. The first region is made of at least germanium, and the second region includes a C-shaped ferroelectric layer and a C-shaped gate that are sequentially stacked. The C-shaped ferroelectric layer serves as a memory layer of the memory device.

13 Claims, 9 Drawing Sheets

(56) References Cited

U.S. PATENT DOCUMENTS

| | | |
|---|---|---|
| 2021/0183872 A1* | 6/2021 | Lai .................. H10B 20/25 |
| 2021/0351191 A1 | 11/2021 | Lai et al. |
| 2021/0366932 A1 | 11/2021 | Lee et al. |
| 2023/0081427 A1* | 3/2023 | Chien ............... H10B 51/40 |
| | | 257/43 |
| 2023/0269926 A1* | 8/2023 | Hsu .................. H10N 50/85 |
| | | 257/295 |

FOREIGN PATENT DOCUMENTS

| | | | |
|---|---|---|---|
| CN | 113690247 A | 11/2021 | |
| TW | 202345360 A * | 11/2023 | ............ H10B 41/27 |
| WO | WO-2021066947 A1 * | 4/2021 | ......... H01L 21/8221 |
| WO | 2021236166 A1 | 11/2021 | |

* cited by examiner

SEMICONDUCTOR DEVICE HAVING FERROELECTRIC LAYER IN RECESS AND METHOD FOR MANUFACTURING THE SAME

The present application is the national phase of International Application No. PCT/CN2021/140813, titled "SEMICONDUCTOR DEVICE AND METHOD FOR MANUFACTURING THE SAME", filed on Dec. 23, 2021, which claims priority to Chinese Patent Application No. CN202111535097.2, titled "SEMICONDUCTOR DEVICE AND METHOD FOR MANUFACTURING THE SAME", filed on Dec. 15, 2021 with the China National Intellectual Property Administration, which is incorporated herein by reference in its entirety.

FIELD

The present disclosure relates to the field of semiconductor devices, and in particular to a semiconductor device and a method for manufacturing the semiconductor device.

BACKGROUND

Memory devices, such as nonvolatile memory devices and dynamic random-access memory (DRAM) devices, have aroused extensive attention with rapid development of semiconductor technology.

Rapid development of computer technology and other technologies brings an increasing demand for high-performance memory devices. Therefore, there is an urgent need for such devices.

SUMMARY

In view of the above, a semiconductor device and a method for manufacturing the semiconductor device are provided according to embodiments of the present disclosure. Accordingly, a performance of memory devices is improved.

A semiconductor device is provided according to an embodiment of the present disclosure. The semiconductor device includes: a substrate; a first electrode layer, located at a side of the substrate; a functional layer, located at a side of the first electrode layer away from the substrate, where the functional layer includes a first region and a second region having a C-shaped structure surrounding the first region, the C-shape structure opens toward a direction that is parallel with the substrate and away from the first region, the first region is made of at least germanium, and the second region includes a C-shaped ferroelectric layer and a C-shaped gate that are stacked; and a second electrode layer, located at a side of the functional layer away from the substrate, where the first electrode layer serves as one of a source layer and a drain layer, and the second electrode layer serves as another of the source layer and the drain layer.

In an embodiment, the C-shaped structure of the second region has a curved surface, and a thickness of the C-shaped structure gradually increases along the direction that is parallel with the substrate and away from the first region.

In an embodiment, the first region is made of germanium or silicon germanium.

In an embodiment, the first region is made of silicon germanium, and a mole fraction of germanium increases and then decreases along a direction perpendicular to the substrate.

In an embodiment, the mole fraction of germanium ranges from 10% to 70%.

In an embodiment, the ferroelectric layer is made of HfZrO, and a thickness of the ferroelectric layer ranges from 3 nm to 30 nm.

In an embodiment, an isolation layer surrounding the first electrode layer, the functional layer, and the second electrode layer is located on the substrate. A first contact, a second contact, and a gate contact, which run through the isolation layer, are electrically connected with the first electrode layer, the second electrode layer, and the gate, respectively.

A method for manufacturing a semiconductor device is provided according to an embodiment of the present disclosure. The method includes: forming a first electrode layer, a semiconductor layer made of at least germanium, and a second electrode layer at a side of a substrate in the above-listed sequence, where the first electrode layer serves as one of a source layer and a drain layer, and the second electrode layer serves as another of the source layer and the drain layer; etching the semiconductor layer from a side wall of the semiconductor layer to form a C-shaped cavity, where the semiconductor layer remaining after the etching serves as a first region, and the C-shaped cavity opens toward a direction that is parallel with the substrate and away from the first region; and forming a ferroelectric layer and then a gate in the C-shaped cavity, where the ferroelectric layer and the gate form a second region surrounding the first region.

In an embodiment, the semiconductor layer is made of silicon germanium, and a mole fraction of germanium increases and then decreases along a direction perpendicular to the substrate. Etching the semiconductor layer from the side wall of the semiconductor layer includes: performing atomic layer etching on the semiconductor layer from the side wall to form the C-shaped cavity.

In an embodiment, the semiconductor layer is made of germanium. Etching the semiconductor layer from the side wall of the semiconductor layer includes: performing atomic layer etching on the semiconductor layer, with an etchant having an anisotropic etching rate for different crystal planes of the germanium, from the side wall to form the C-shaped cavity.

The semiconductor device is provided according to embodiments of the present disclosure. The semiconductor device includes the substrate, the first electrode layer, the functional layer, and the second electrode layer. The functional layer is located between the first electrode layer and the second electrode layer, and includes the first region and the second region having the C-shaped structure surrounding the first region. The C-shape structure opens toward the direction that is parallel with the substrate and away from the first region, that is, the C-shaped structure opens toward a distal side. The first region is made of at least germanium, and the second region includes the C-shaped ferroelectric layer and the C-shaped gate that are sequentially stacked. In embodiments of the present disclosure, the C-shaped ferroelectric layer serves as a memory layer of the memory device. A C-shaped channel is capable to increase an electric field within the ferroelectric layer under a fixed gate voltage, and to increase a memory window of the semiconductor device. In one embodiment, the C-shaped channel is capable to reduce a gate voltage decreased under a fixed storage window of the whole semiconductor device, and to reduce power consumption of the semiconductor device. Hence, a performance of the memory device is improved.

BRIEF DESCRIPTION OF THE DRAWINGS

For clearer illustration of the embodiments of the present disclosure, hereinafter briefly described are the drawings to be applied in embodiments of the present disclosure. Apparently, the drawings in the following descriptions are only some embodiments of the present disclosure.

DETAILED DESCRIPTION OF EMBODIMENTS

Embodiments of the present disclosure are described in detail in conjunction with the drawings.

Various specific details are set forth in following description to facilitate a full understanding of the present disclosure. The present disclosure may be implemented in a manner different from those described herein. Therefore, the present disclosure is not limited by the specific embodiments disclosed hereinafter.

In addition, the present disclosure is described in detail in conjunction with schematic diagrams. In order to facilitate explanation, when describing embodiments of the present disclosure in detail, a cross-sectional view of a device structure may not show parts that are enlarged to scale. The schematic diagrams are only exemplary, and shall not limit the protection scope of the present disclosure. In addition, three-dimensional spatial dimensions, including a length, a width, and a depth should be considered in actual manufacturing.

At present, a demand for high-performance memory devices is growing. Therefore, there is an urgent need for such devices.

In view of the above issue, a semiconductor device is provided according to embodiments of the present disclosure. The semiconductor device includes a substrate, a first electrode layer, a functional layer, and a second electrode layer. The functional layer is located between the first electrode layer and the second electrode layer, and includes a first region and a second region having a C-shaped structure surrounding the first region. The C-shape structure opens toward a direction that is parallel with the substrate and away from the first region, that is, the C-shaped structure opens toward a distal side. The first region is made of at least germanium, and the second region includes a C-shaped ferroelectric layer and a C-shaped gate that are sequentially stacked. In embodiments of the present disclosure, the C-shaped ferroelectric layer serves as a memory layer of the memory device. A C-shaped channel is capable to increase an electric field within the ferroelectric layer under a fixed gate voltage, and to increase a memory window of the semiconductor device. In one embodiment, the C-shaped channel is capable to reduce a gate voltage decreased under a fixed storage window of the whole semiconductor device, and to reduce power consumption of the semiconductor device. Hence, a performance of the memory device is improved.

In order to facilitate understanding of the embodiments of the present disclosure, hereinafter embodiments are described in combination with the drawings.

Figure 1:
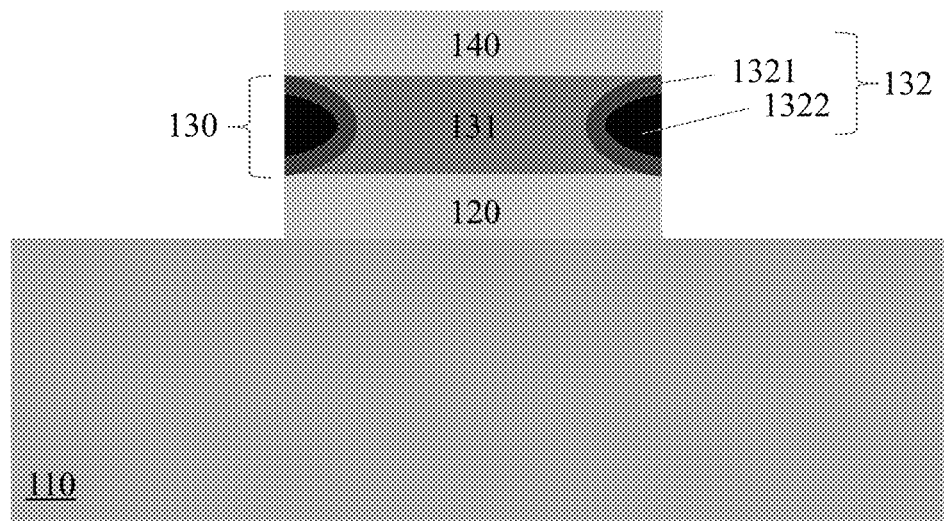
FIG. 1 is a schematic structural diagram of a semiconductor device according to an embodiment of the present disclosure.

Reference is made to FIG. 1, which is a schematic structural diagram of a semiconductor device according to an embodiment of the present disclosure. According to embodiments of the present disclosure, the semiconductor device is a memory device, for example, a nonvolatile memory device or a dynamic random-access memory (DRAM) device. Herein the semiconductor device may be a vertical transistor device, such as a vertical field effect transistor (FET).

In an embodiment, the semiconductor device includes a substrate 110, a first electrode layer 120, a functional layer 130, and a second electrode layer 140, as shown in FIG. 1.

The substrate 110 may be a semiconductor substrate, for example, a silicon substrate. The first electrode layer 120 is located at a side of the substrate 110. The functional layer 130 is located at a side of the first electrode layer 120 away from the substrate 110. The second electrode layer 140 is located at a side of the functional layer 130 away from the substrate 110. That is, the first electrode layer 120, the functional layer 130, and the second electrode layer 140 are sequentially stacked. The first electrode layer 110 serves as one of a source layer and a drain layer, and the second electrode layer 140 serves as the other of the source layer and the drain layer.

Each of the first electrode layer 120 and the second electrode layer 140 has a thickness ranging from 10 nm to 50 nm. The first electrode layer 120 and the second electrode layer 140 are semiconductor layers doped with dopants of the same type. The first electrode layer 120 and the second electrode layer 140 may be both n-type doped or both p-type doped.

As an example, the first electrode layer 120 is a silicon layer that is p-type doped with B or In, and a concentration of the dopant ranges from 1e18 $cm^{-3}$ to 2e20 $cm^{-3}$. The second electrode layer 120 is another silicon layer that is p-type doped with B or In, and a concentration of the dopant ranges from 1e18 $cm^{-3}$ to 2e20 $cm^{-3}$.

As another example, the first electrode layer 120 is a silicon layer that is n-type doped with As or P, and a concentration of the dopant ranges from 1e18 $cm^{-3}$ to 2e20 $cm^{-3}$. The second electrode layer 120 is another silicon layer that is n-type doped with As or P, and a concentration of the dopant ranges from 1e18 $cm^{-3}$ to 2e20 $cm^{-3}$.

In an embodiment, the functional layer 130 is arranged between the first electrode layer 120 and the second electrode layer 140. The functional layer 130 includes a first region 131 and a second region 132 having a C-shaped structure surrounding the first region 131. The C-shaped structure of the second region 132 opens toward a direction which is parallel with the substrate 110 and points away from the first region 131. That is, an opening of the C-shaped cavity of the second region 132 faces a distal side. A C-shaped ferroelectric layer 1321 and a C-shaped gate 1322, which are sequentially stacked, are located in the C-shaped cavity of the second region 132.

A width of the first region 131 gradually decreases and then increases along a direction perpendicular to the substrate 110. That is, the first region 131 has a structure in which an upper width and a lower width are greater than a middle width, similar to a structure of the letter "X".

In an embodiment, the C-shaped structure of the second region 132 has a curve surface, and a thickness of the C-shaped structure gradually increases along the direction which is parallel with the substrate 110 and points away from the first region 131. That is, the C-shaped structure of the second region 132 is curved, and a curvature changes gradually in a direction approaching the first region 131. The curved surface of the C-shaped structure facilitates forming the C-shaped ferroelectric layer in a C-shaped cavity in manufacturing, and the C-shaped ferroelectric layer 1321 can improve a performance of the memory device.

The first region 131 is made of at least germanium. For example, the first region 131 is made of germanium or silicon germanium. The material including germanium facilitates forming the C-shaped cavity, and form the C-shaped ferroelectric layer 1321 can be formed in the C-shaped cavity.

In a case that the first region 131 is made of silicon germanium, a mole fraction of germanium first increases and then decreases along the direction perpendicular to the substrate 110. That is, along the direction perpendicular to the substrate 110, the mole fraction of germanium in a middle portion is greater than that in an upper portion and that in a lower portion, which facilitates forming the C-shaped cavity.

In the direction perpendicular to the substrate 110, the mole fraction of germanium may change gradually, which facilitates forming the C-shaped cavity of which the curvature changes uniformly.

The mole fraction of germanium ranges from 10% to 70%. In a case that the mole fraction is too small, the C-shaped cavity cannot be formed. In a case that the mole fraction is too large, there would be a lot of lattice defects, which may reduce a performance of memory device.

In an embodiment, the mole fraction of germanium along the direction perpendicular to the substrate 110 may be controlled to form the curved surface in the C-shaped cavity. The larger a difference in the mole fraction of germanium is between the middle portion and the upper/lower portion, the deeper the formed C-shaped cavity is in the direction parallel with the substrate 110.

The ferroelectric layer 1321 may be made of a ferroelectric material, such as HfZrO, that is, $Hf_xZr_{1-x}O_2$. Hence, the memory device utilizes the ferroelectric material for data storage in embodiments of the present disclosure.

A thickness of the ferroelectric layer 1321 ranges from 3 nm to 30 nm. Ferroelectric characteristics may be lost in a case that the ferroelectric layer 1321 is too thick. Therefore, an appropriate thickness can improve a performance of the memory device.

The gate 1322 may be made of a material having good conductivity, such as TiN, TaN, and W.

In embodiments of the present disclosure, the C-shaped ferroelectric layer serves as a memory layer of the memory device. A C-shaped channel is capable to increase an electric field within the ferroelectric layer under a fixed gate voltage, and to increase a memory window of the semiconductor device. In one embodiment, the C-shaped channel is capable to reduce a gate voltage decreased under a fixed storage window of the whole semiconductor device, and to reduce power consumption of the semiconductor device. Hence, a performance of the memory device is improved. In embodiments of the present disclosure, the source, the functional layer, and the drain are sequentially stacked to provide a channel perpendicular to a surface of the substrate. In one embodiment, a vertical memory device is formed, and is applicable to 3D integration scenarios. An integration density is further improved, and power consumption of device is reduced.

Figure 2:
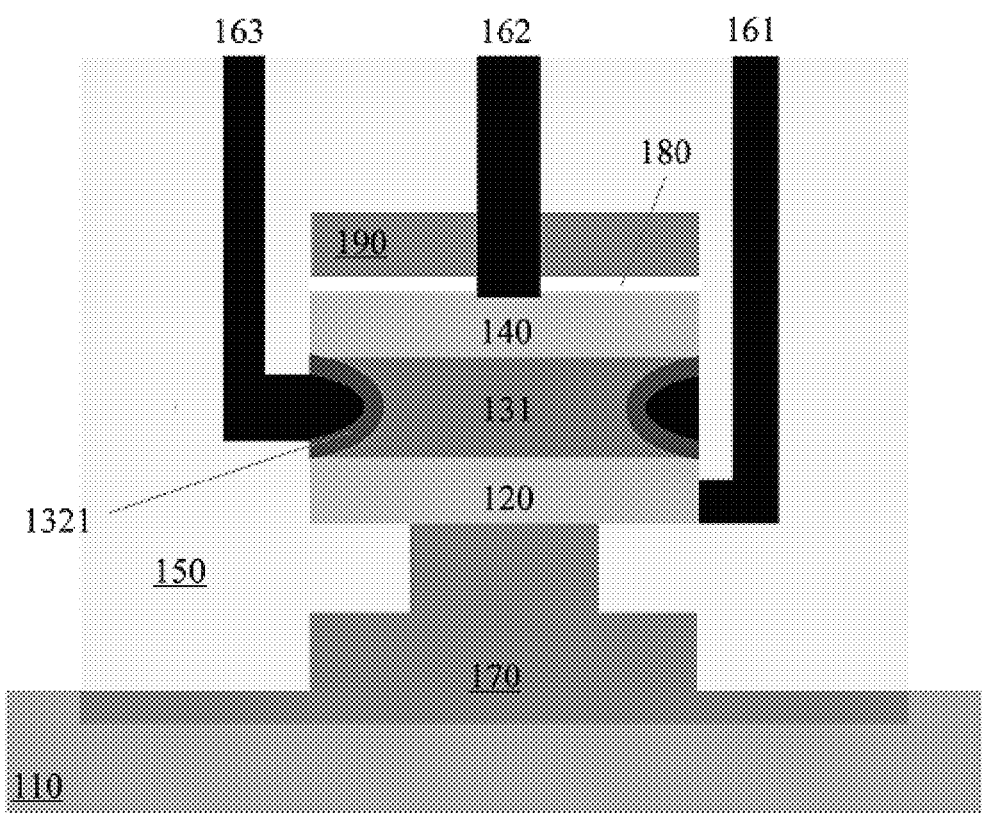
FIG. 2 is a schematic structural diagram of another semiconductor device according to an embodiment of the present disclosure.

In an embodiment of the present disclosure, the semiconductor device further includes an isolation layer 150, a first contact 161, a second contact 162, and a gate contact 163, as shown in FIG. 2.

The isolation layer 150 is located on the substrate 110, and surrounds the first electrode layer 120, the functional layer 130, and the second electrode layer 140, in order to isolate and protect the device. The isolation layer 150 may be made of a dielectric material having good insulation, such as silicon oxide.

The first contact 161, the second contact 162 and the gate contact 163 run through the isolation layer 150, and are electrically connected with the first electrode layer 120, the second electrode layer 140, and the gate 1322, respectively. Hence, the first electrode layer 120, the second electrode layer 140, and the gate 1322 are electrically introduced to outside.

In an embodiment, a well layer 170 is provided between the first electrode layer 120 and the substrate 110. Reference is made to FIG. 2. The well layer 170 is formed through doping a region of the substrate 110. Compared with the undoped substrate 110, the doped well layer 170 has better conductivity and provides good electrical contact with the first electrode layer 120. The well layer 170 may be n-type doped with As or P, and a concentration of the dopant ranges from 1e17 $cm^{-3}$ to 2e19 $cm^{-3}$. In one embodiment, the well layer 170 may be p-type doped with B or In, and a concentration of the dopant ranges from 1e17 $cm^{-3}$ to 2e19 $cm^{-3}$.

In an embodiment, the second electrode layer 140 is covered with an etch stop layer 180 and a dielectric layer 190.

The etch stop layer 180 covers the second electrode layer 140 to protect the second electrode layer 140 that is beneath the etch stop layer 180. In addition, the etch stop layer can serve as a barrier which prevents the second electrode layer 140 from being damaged when forming the second contact 162 for the second electrode layer 140. The etch stop layer 180 may be made of silicon oxide. A thickness of the etch stop layer 180 may range from 2 nm to 5 nm.

The etch stop layer 180 is further covered with the dielectric layer 190. The dielectric layer 190 is configured to isolate a hard mask layer from the second electrode layer 140 when manufacturing the device. The dielectric layer 190 is further configured to isolate the second contact 162 after the second contact 162 is formed for the second electrode layer 140. In one embodiment, it is ensured that the second contact 162 is electrically connected only to the second electrode layer 140 in the semiconductor device. The dielectric layer 190 may be made of silicon nitride or a low-κ material, and a thickness of the dielectric layer 190 may range from 10 nm to 100 nm.

In an embodiment, the second region 132 further includes an interface layer (not indicated in the figures). The interface layer is located between the first region 131 and the second region 132. The interface layer is for improving quality of an interface and hence further improving a performance of the semiconductor device. The interface layer may be made of silicon oxide.

Figure 3:
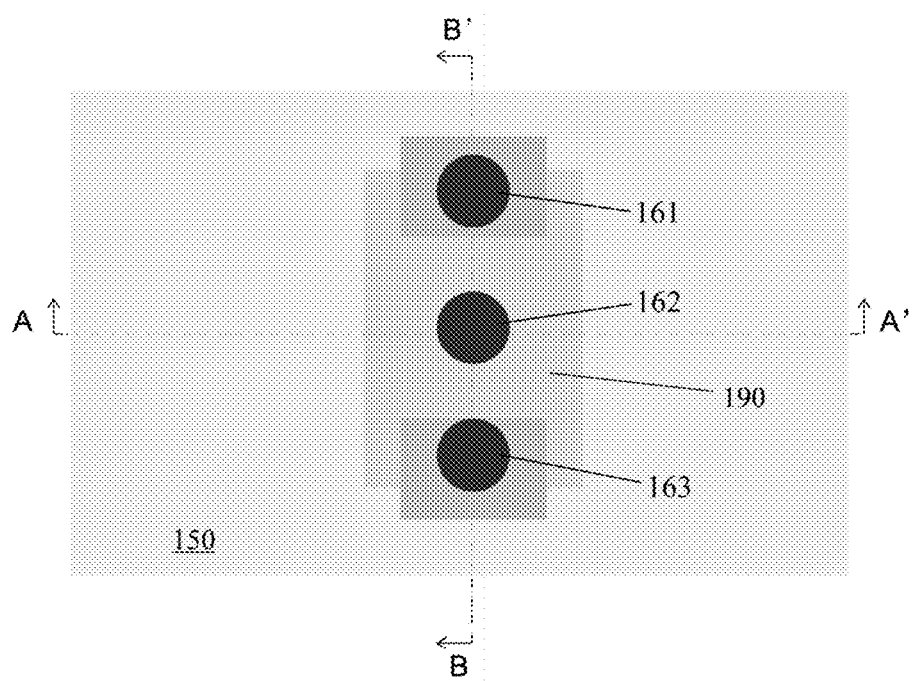
FIG. 3 is a top view of a structure of a semiconductor device as shown in FIG. 2 according to an embodiment of the present disclosure.

In an embodiment, the schematic structural diagrams as shown in FIG. 1 and FIG. 2 may be regarded as cross-section views of a semiconductor device as shown in FIG. 3 along a direction indicated by BB'.

Figure 4:
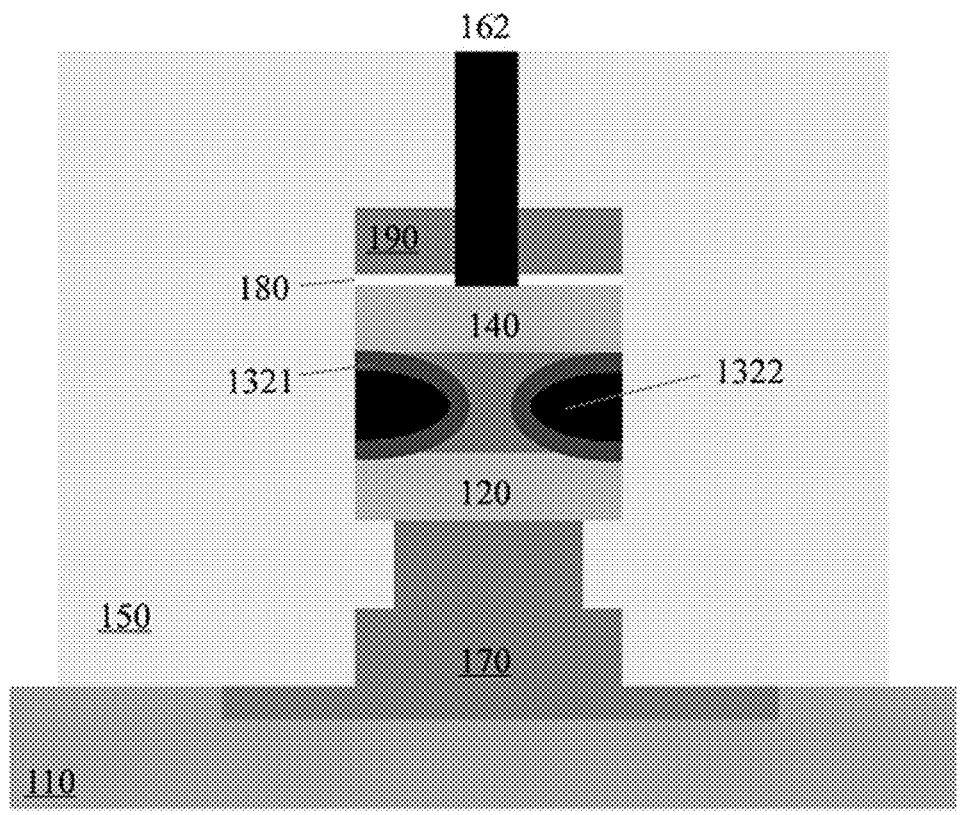
FIG. 4 is a cross-sectional view of the structure of a semiconductor device as shown in FIG. 3 along a direction indicated by AA'.

Reference is made to FIG. 4, which is a cross-sectional view of a structure of the semiconductor device as shown in FIG. 3 along a direction indicated by AA'. FIG. 4 indicates that the C-shaped structure is located on the side wall(s) of the semiconductor device in all directions.

In summary, the semiconductor device according to embodiments of the present disclosure includes the substrate, the first electrode layer, the functional layer, and the second electrode layer. The functional layer is located between the first electrode layer and the second electrode layer, and includes the first region and the second region having the C-shaped structure surrounding the first region. The C-shape structure opens toward the direction that is parallel with the substrate and away from the first region, that is, the C-shaped structure opens toward a distal side. The first region is made of at least germanium, and the second region includes the C-shaped ferroelectric layer and the C-shaped gate that are sequentially stacked. In embodiments of the present disclosure, the C-shaped ferroelectric layer serves as a memory layer of the memory device. A C-shaped channel is capable to increase an electric field within the ferroelectric layer under a fixed gate voltage, and to increase a memory window of the semiconductor device. In one embodiment, the C-shaped channel is capable to reduce a gate voltage decreased under a fixed storage window of the whole semiconductor device, and to reduce power consumption of the semiconductor device. Hence, a performance of the memory device is improved.

Figure 5:
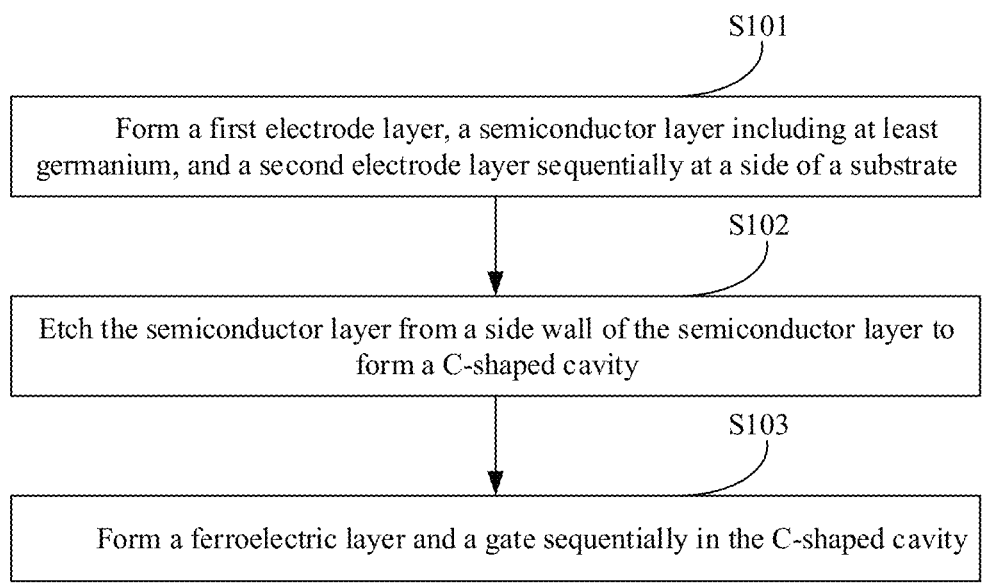
FIG. 5 is a flowchart of a method for manufacturing a semiconductor device according to an embodiment of the present disclosure.

On a basis of the semiconductor device according to the forgoing embodiments, a method for manufacturing a semiconductor device is further provided according to an embodiment of the present disclosure. Reference is made to FIG. 5, which is a flowchart of a method for manufacturing a semiconductor device according to an embodiment of the present disclosure. The method includes following steps S101 to S103.

Figure 6:
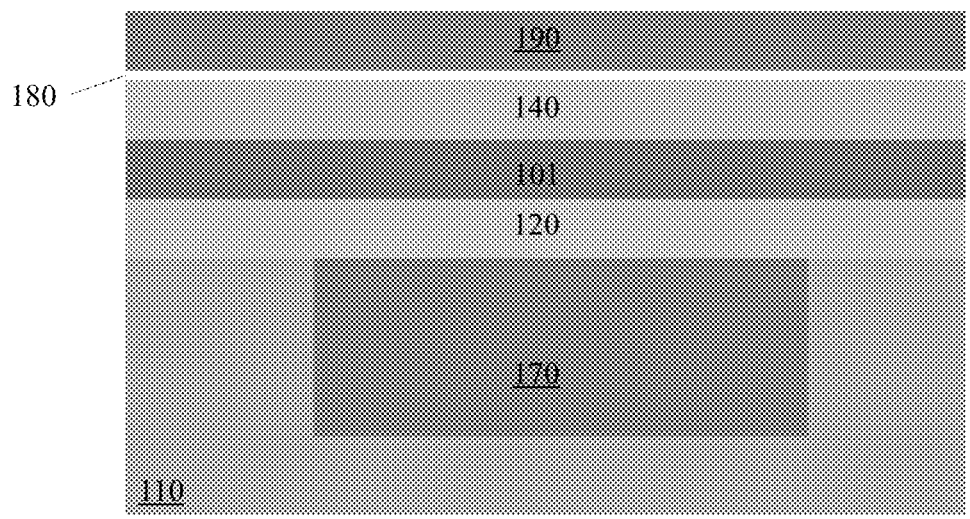
FIG. 6 to FIG. 18 are schematic structural diagrams each showing a semiconductor device manufactured through a method according to the embodiment of the present disclosure.

In step S101, a first electrode layer 120, a semiconductor layer 101 made of at least germanium, and a second electrode layer 140 are sequentially formed at a side of a substrate 110. Reference is made to FIG. 6.

In an embodiment, the first electrode layer 120, the semiconductor layer 101 made of at least germanium, and the second electrode layer 140 may be sequentially formed on a surface at a side of the substrate 110. In one embodiment, the first electrode layer 120, the semiconductor layer 101 made of at least germanium, and the second electrode layer 140 may be grown through epitaxy.

The substrate 110 may be, for example, a semiconductor substrate. Before the first electrode layer 120 is formed on the surface at the side of the substrate 110, a well layer 170 may be formed in the substrate 110 as shown in FIG. 6. The well layer 170 is formed through doping a region of the substrate 110. Compared with the undoped substrate 110, the doped well layer 170 has better conductivity and provides good electrical contact with the first electrode layer 120. The well layer 170 may be n-type doped with As or P, and a concentration of the dopant ranges from $1e17$ $cm^{-3}$ to $2e19$ $cm^{-3}$. In one embodiment, the well layer 170 may be p-type doped with B or In, and a concentration of the dopant ranges from $1e17$ $cm^{-3}$ to $2e19$ $cm^{-3}$. The silicon substrate may be injected with dopant ions and then annealed to form the well layer 170.

As an example, the well layer 170 is formed by injecting p-type impurities for an n-type field effect transistor (FET), or injecting n-type impurities for a p-type FET.

In an embodiment, each of the first electrode layer 120 and the second electrode layer 140, after grown through epitaxy, has a thickness ranging from 10 nm to 50 nm. The first electrode layer 120 and the second electrode layer 140 are semiconductor layers doped with a same type of dopants. The dopants may be of the n-type or the p-type. Since the first electrode layer 110 serves as one of the source layer and the drain layer, and the second electrode layer 140 serves as the other of the source layer and the drain layer, conductivity of the first electrode layer 120 and the second electrode layer 140 may be improved through doping, particularly in-situ doping.

A p-type FET is taken as an example. The first electrode layer 120 is a silicon layer that is p-typed doped with B or In, and a concentration of dopants ranges from $1e18$ $cm^{-3}$ to $2e20$ $cm^{-3}$. The second electrode layer 140 is a silicon layer that is p-typed doped with B or In, and a concentration of dopants ranges from $1e18$ $cm^{-3}$ to $2e20$ $cm^{-3}$.

An n-type FET is taken as another example. The first electrode layer 120 is a silicon layer that is n-typed doped with As or P, and a concentration of dopants ranges from $1e18$ $cm^{-3}$ to $2e20$ $cm^{-3}$. The second electrode layer 140 is a silicon layer that is n-typed doped with As or P, and a concentration of dopants ranges from $1e18$ $cm^{-3}$ to $2e20$ $cm^{-3}$.

In an embodiment, after the first electrode layer 120 is grown through epitaxy, the semiconductor layer 101 made of at least germanium may be grown on the first electrode layer 120 through epitaxy. The semiconductor layer 101 includes at least germanium, for example, germanium or silicon germanium. A thickness of the semiconductor layer 101 ranges from 5 nm to 500 nm.

In an embodiment, the semiconductor layer 101 is made of germanium, i.e., Ge. Reference is made to FIG. 6.

In another embodiment, the semiconductor layer 101 is made of silicon germanium, i.e., SiGe. A mole fraction of germanium first increases and then decreases in a direction perpendicular to the substrate 110. That is, concentration of Ge in the middle portion is greater than that in the upper portion and that in the lower region. Ge concentration is high in the middle portion and low in the upper and lower regions, and an etching rate for a region having high Ge concentration is greater than that of a region having low Ge concentration. Therefore, a C-shaped cavity can be formed in subsequent etching.

The mole fraction of germanium ranges from 10% to 70%. In a case that the mole fraction is too small, the C-shaped cavity cannot be formed. In a case that the mole fraction is too large, there would be a lot of lattice defects, which may reduce a performance of memory device.

Figure 7:
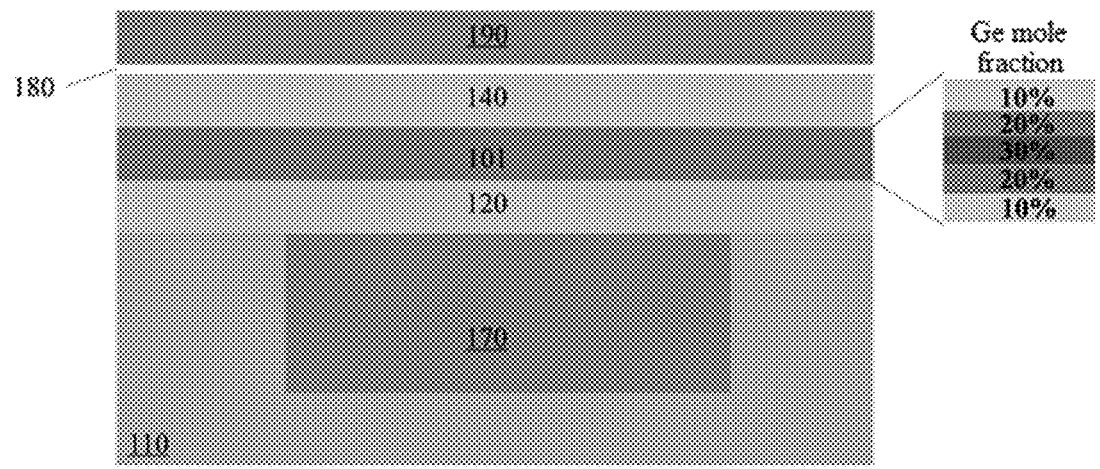

Reference is made to FIG. 7. As an example, the mole fraction of germanium increases from 10% in the upper/lower portion to 30% in the middle portion, which induces a gradual change in the mole fraction of germanium along the direction perpendicular to the substrate 110.

In one embodiment, multiple layers of SiGe may be grown through epitaxy when forming the semiconductor layer 101 having varying Ge concentration. For example, about to 100 layers of SiGe, each of which has a thickness ranging from 1 nm to 5 nm, are formed. A final shape of the curved surface of the U-shaped cavity may be controlled via the mole fraction of germanium along the direction perpendicular to the substrate 110. The larger a difference in the mole fraction of germanium is between the middle portion and the upper/lower portion, the deeper the formed C-shaped cavity is along the direction parallel with the substrate 110. The mole fraction of germanium may change gradually, which facilitates forming the C-shaped cavity of which a curvature changes uniformly. Therefore, in actual manufacturing, a range within which the Ge concentration varies, a quantity of the grown SiGe layers, and a variation trend of the Ge concentration are controlled on requirement.

In an embodiment, after the semiconductor layer 101 is grown through epitaxy, the second electrode layer 140 is grown on the semiconductor layer 101 through epitaxy. Then, the etch stop layer 180 and the dielectric layer 190 are sequentially formed on the second electrode layer 140. In one embodiment, the etch stop layer 180 and the dielectric layer 190 may be formed through deposition.

The etch stop layer 180 covers the second electrode layer 140 to protect the second electrode layer 140 that is located beneath the etch stop layer 180. In addition, the etch stop layer serves as a barrier preventing the second electrode layer 140 from being damaged when forming the second contact 162 for the second electrode layer 140. The etch stop layer 180 may be made of silicon oxide, and may be made of silicon oxide having high crystalline quality formed under high temperature, and to improve a performance of the semiconductor device. A thickness of the etch stop layer 180 may range from 2 nm to 5 nm.

The etch stop layer 180 is further covered with the dielectric layer 190. The dielectric layer 190 is configured to isolate a hard mask layer from the second electrode layer 140 when manufacturing the device. The dielectric layer 190 is further configured to isolate the second contact 162 after the second contact 162 of the second electrode layer 140 is formed. In one embodiment, it is ensured that the second contact 162 is electrically connected with only the second electrode layer 140 in the semiconductor device. The dielectric layer 190 may be made of silicon nitride or a low-κ material, and a thickness of the dielectric layer 190 may range from 10 nm to 100 nm.

Figure 8:
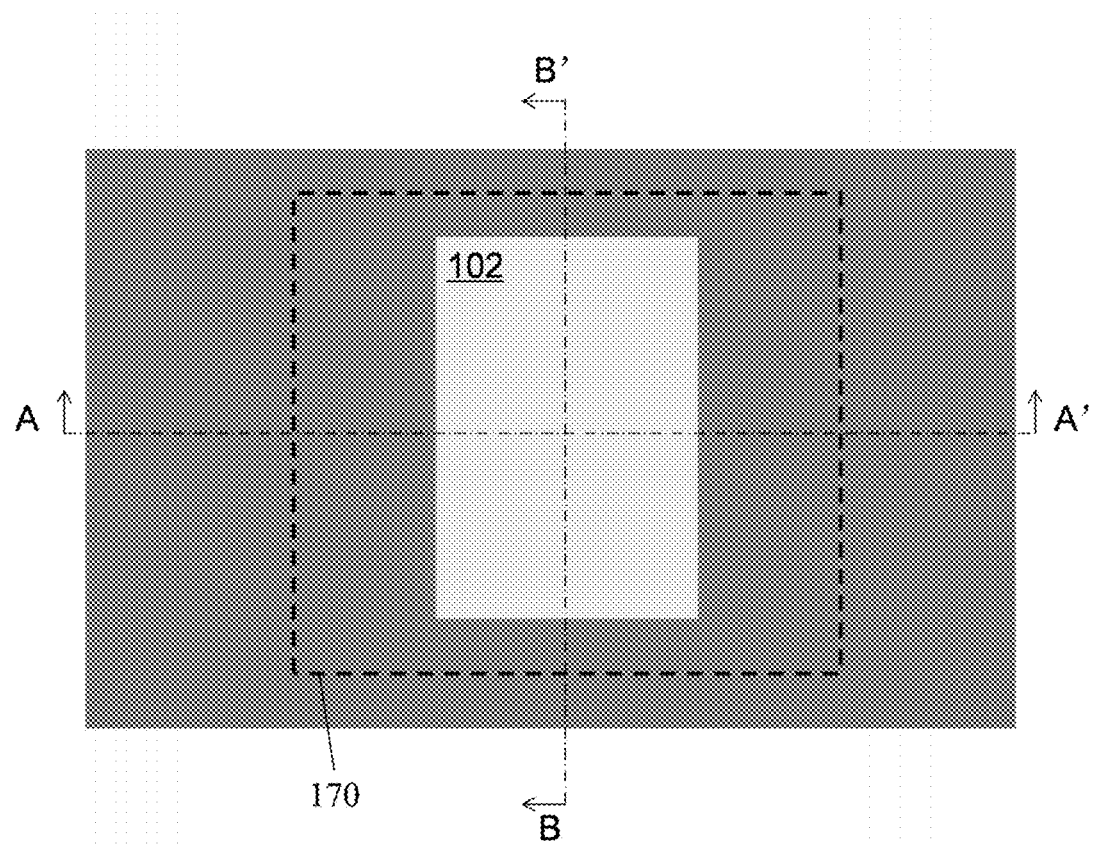
Figure 9:
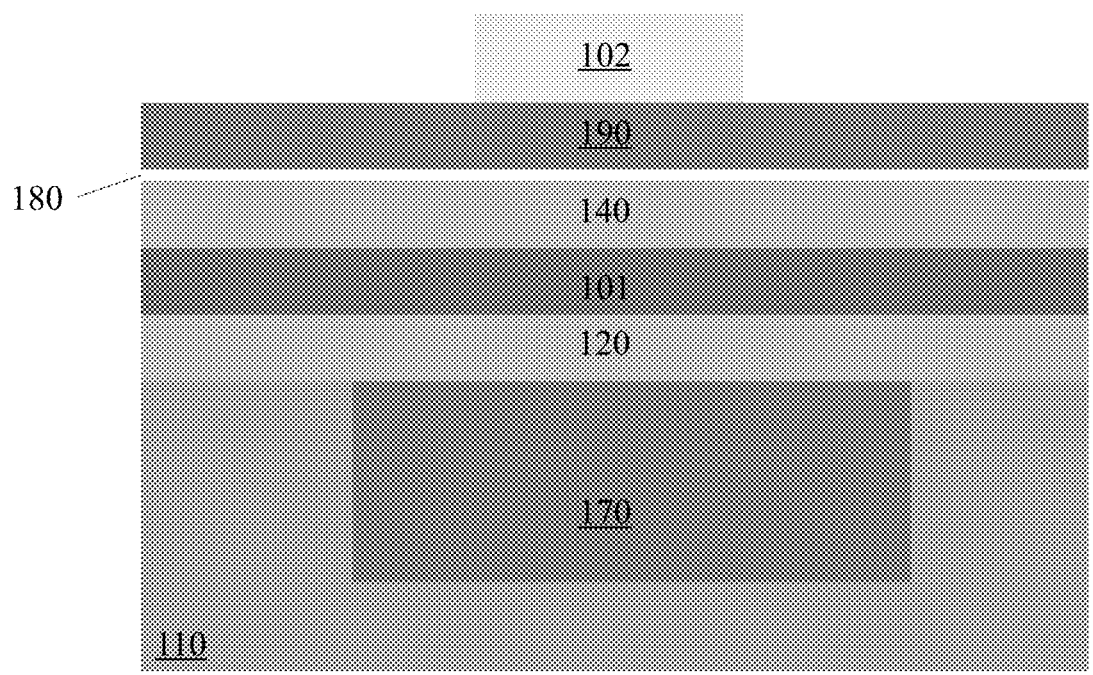

In an embodiment, a patterned photoresist layer 102 may further be formed on the dielectric layer 190, after the well layer 170, the first electrode layer 120, the semiconductor layer 101, the second electrode layer 140, the etch stop layer 180, and the dielectric layer 190 are sequentially formed. The patterned photoresist layer 102 defines an active region of the semiconductor device. A projection of the active region on the substrate 110 is located within the well layer 170, as shown in FIG. 8 or FIG. 9. FIG. 8 is a top view of a structure of a semiconductor device during manufacturing, and FIG. 9 is a cross-sectional view of a structure of a semiconductor device as shown in FIG. 8 along a direction indicated by AA'.

Figure 10:
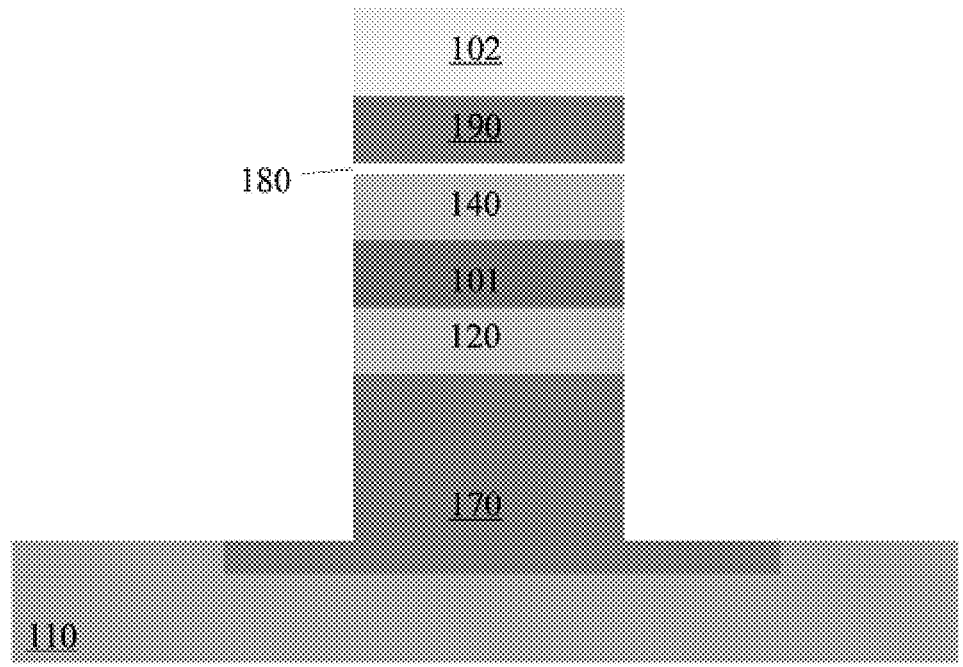
Figure 11:
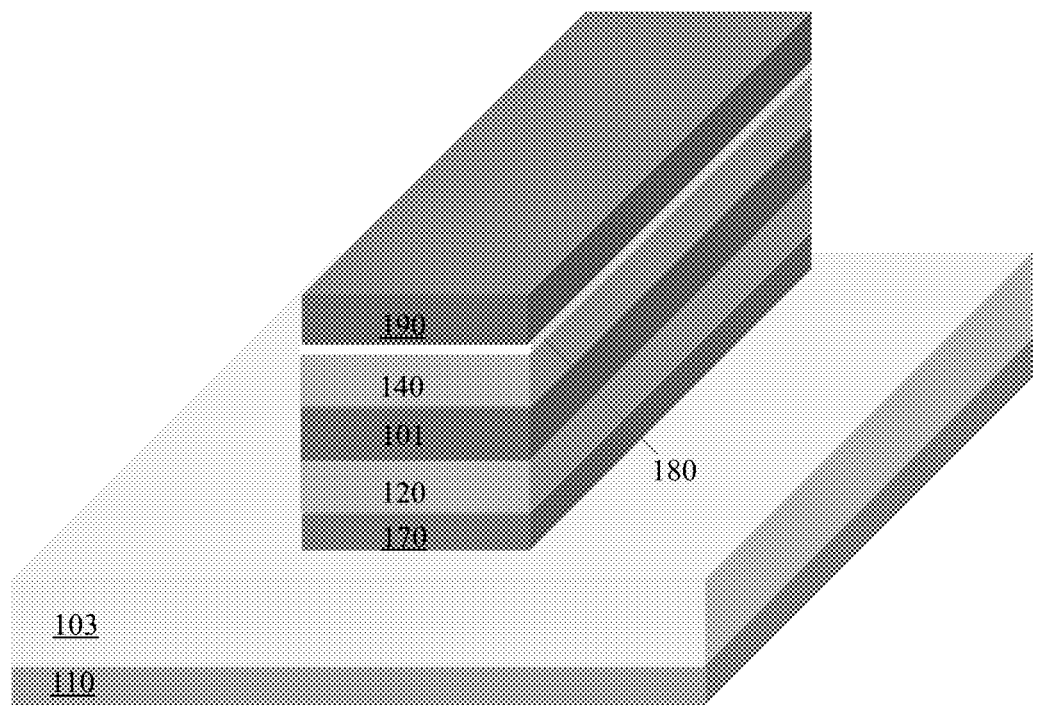
Figure 12:
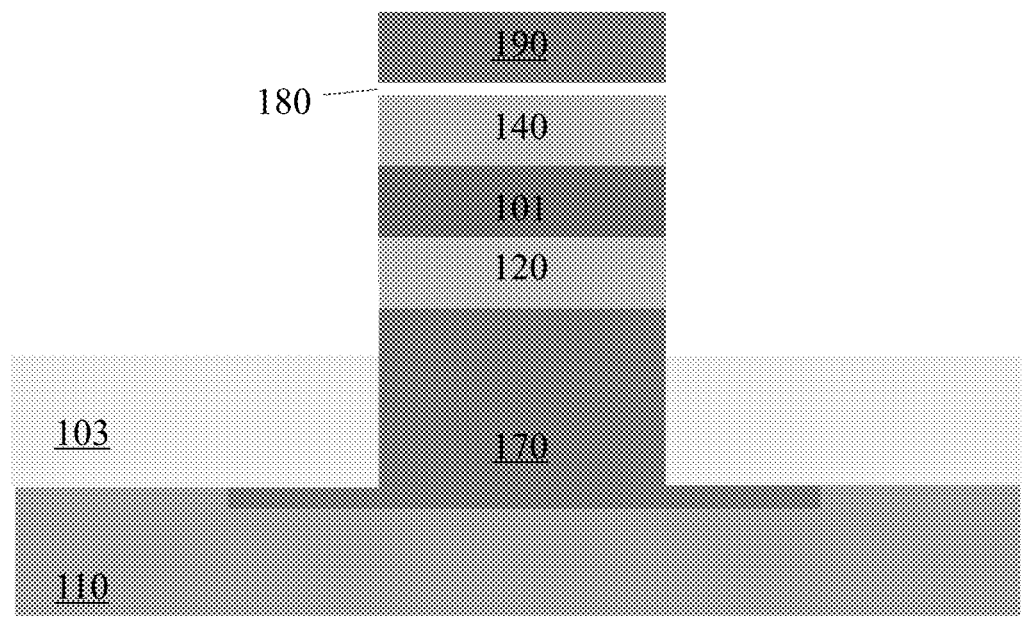
Figure 13:
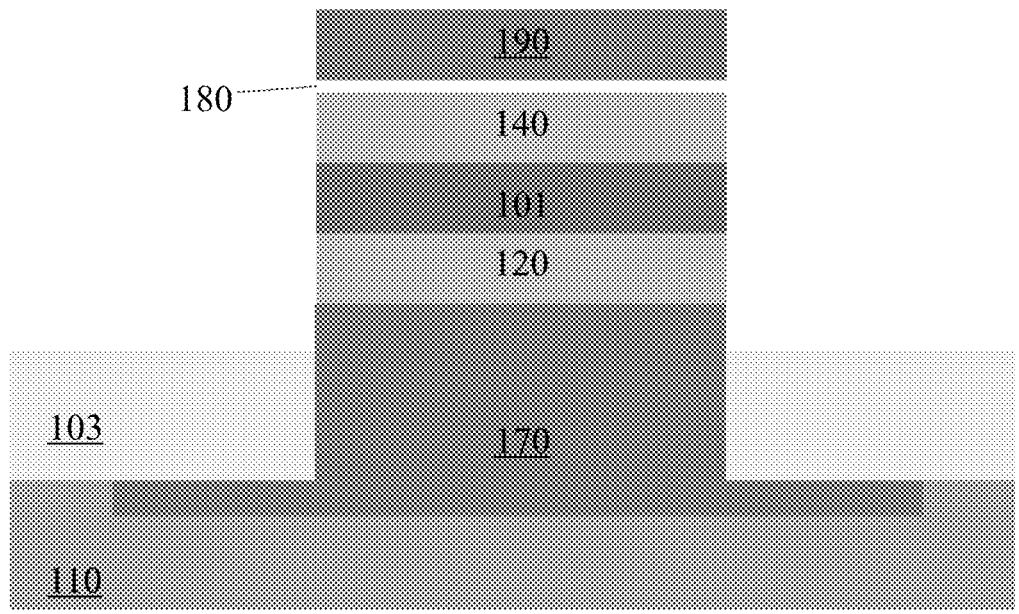

Then, the dielectric layer 190, the etch stop layer 180, the second electrode layer 140, the semiconductor layer 101, the first electrode layer 120, and a part of the well layer 170 are etched by using the patterned photoresist layer 102. Reference is made to FIG. 10. After the etching, the photoresist layer 102 is removed, and a dielectric material is deposited to cover a current semiconductor device completely. Afterwards, a shallow trench isolation (STI) layer 103 is formed through chemical mechanical polishing (CMP) and etching. Reference is made to FIG. 11, FIG. 12, and FIG. 13. FIG. 11 is a schematic diagram of a three-dimensional structure of a semiconductor device during manufacturing. FIG. 12 is a cross-sectional view of a structure of a semiconductor device as shown in FIG. 11 along a direction indicated by AA'. FIG. 13 is a cross-sectional view of a structure of a semiconductor device as shown in FIG. 11 along a direction indicated by BB'. The shallow trench isolation (STI) layer 103 is configured to isolate the semiconductor device from another semiconductor device that is formed when manufacturing an integrated circuit. The dielectric material may be made of silicon oxide. The etching may be wet etching or dry etching.

Figure 14:
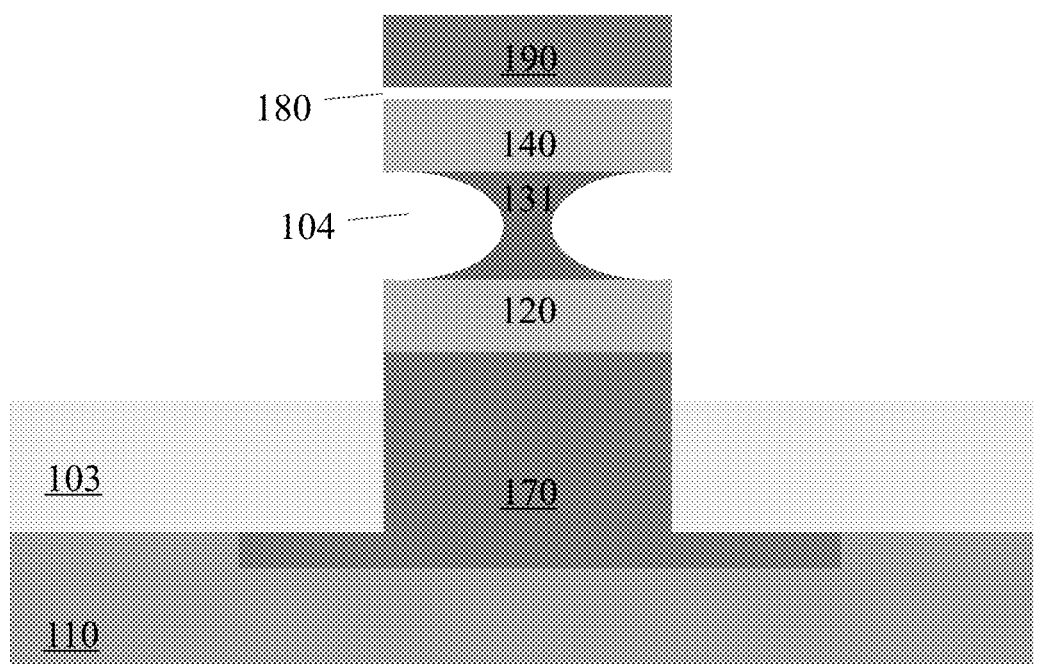
Figure 15:
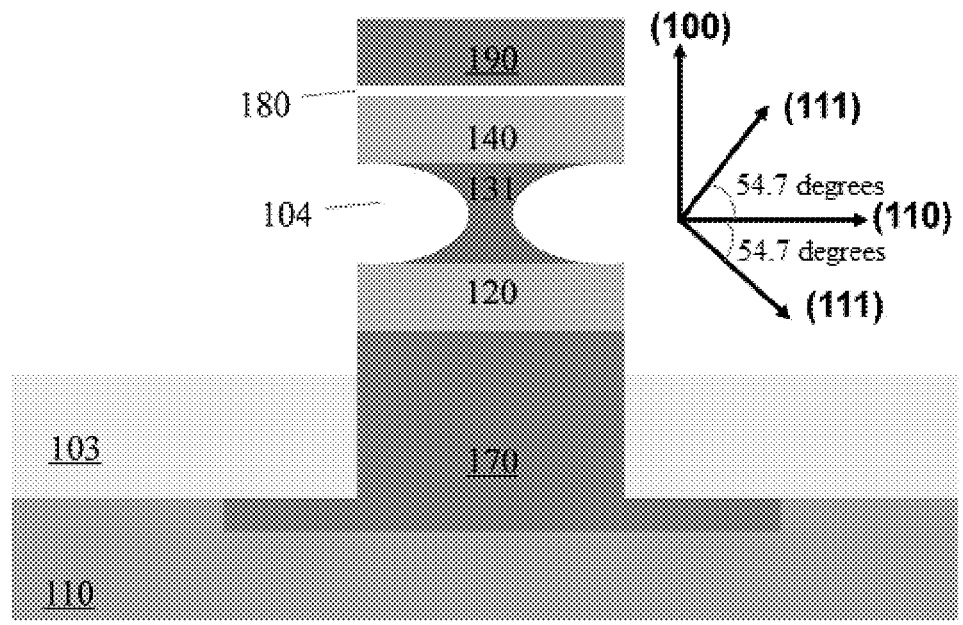
Figure 16:
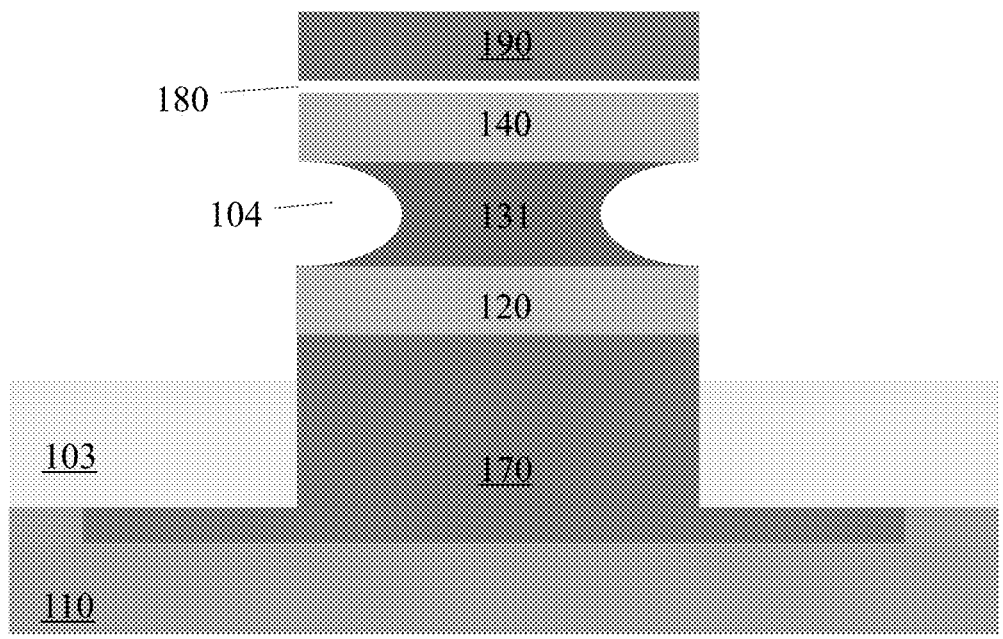

In step S102, the semiconductor layer 101 is etched from a side wall of the semiconductor layer 101 to form a C-shaped cavity 104. Reference is made to FIG. 14, FIG. 15, and FIG. 16.

In an embodiment, the semiconductor layer 101 is etched from the side wall of the semiconductor layer 101 to form the C-shaped cavity 104, after the dielectric layer 190, the etch stop layer 180, the second electrode layer 140, the semiconductor layer 101, the first electrode layer 120, and a part of the well layer 170 are etched. The semiconductor layer 101 remaining after the etching serves as the first region 131. The C-shaped cavity 104 opens toward a direction which is parallel with the substrate 110 and points away from the first region 131. That is, an opening of the C-shaped cavity 104 faces a distal side, as shown in FIG. 14, FIG. 15, and FIG. 16. FIG. 14 and FIG. 15 are cross-sectional views of structures of semiconductor devices along a direction indicated by AA'. FIG. 16 is a cross-sectional view of a structure of a semiconductor device along a direction indicated by BB'. It can be seen that in embodiments of the present disclosure, the side wall at four sides of the semiconductor device are all etched to form the C-shaped cavity 104.

As shown in FIG. 14, FIG. 15 and FIG. 16, a width of the first region 131 gradually decreases and then increases along the direction perpendicular to the substrate 110. That is, the first region 131 has a structure in which both an upper width and a lower width are greater than a middle width, similar to a structure of the letter "X".

In an embodiment, the C-shaped cavity 104 has a curved surface. A thickness of the C-shaped cavity 104 increases gradually along the direction which is parallel with the substrate 110 and points away from the first region 131. That is, the C-shaped cavity 104 is curved, and a curvature changes gradually in a direction approaching the first region 131. The curved surface of the C-shaped cavity 104 facilitates subsequent formation of the C-shaped ferroelectric layer 1321 in the C-shaped cavity 104. In one embodiment, the C-shaped ferroelectric layer 1321 can improve a performance of the memory device.

When etching the semiconductor layer 101 from the side wall to form the C-shaped cavity 104, the semiconductor layers 101 made of different materials are etched through different processes.

In a case that the semiconductor layer 101 is made of silicon germanium and the mole fraction of germanium increases and then decreases along the direction perpendicular to the substrate 110, the semiconductor layer 101 is etched from the side wall of through atomic layer etching. The Ge concentration is high in the middle portion and low in the upper and lower regions, and an etching rate for a region having high Ge concentration is greater than that for a region having low Ge concentration. Hence, the C-shaped cavity 104 can be formed through atomic layer etching that is accurately controlled. Reference is made to FIG. 14 and FIG. 16. During the etching, an etchant selective to the first electrode layer 120 and the second electrode layer 140 is used, and the first electrode layer 120 and the second electrode layer 140 would not be damaged when forming the C-shaped cavity 104 through etching.

In a case that the semiconductor layer 101 is made of germanium, the semiconductor layer 101 is etched from the side wall through atomic layer etching, and an etchant having anisotropic etching rate for different crystal planes of the germanium is selected for etching. For example, etching rates for a (100) crystal plane and a (110) crystal plane are faster than that for a (111) crystal plane. There is an angle of 54.7 degrees between the (111) crystal plane and the (110) crystal plane, and the C-shaped cavity 104 can be formed through atomic layer etching that is accurately controlled. Reference is made to FIG. 15 and FIG. 16. The etchant for the etching is further required to be selective to the first electrode layer 120 and the second electrode layer 140, and the first electrode layer 120 and the second electrode layer 140 would not be damaged when forming the C-shaped cavity 104 through etching.

Figure 17:
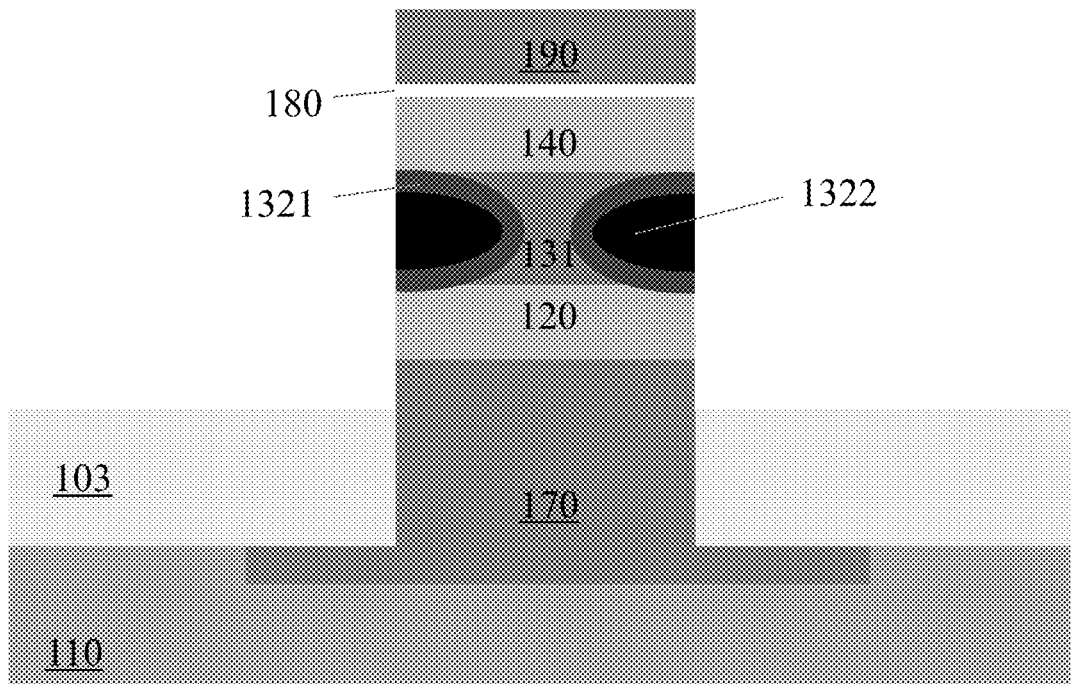
Figure 18:
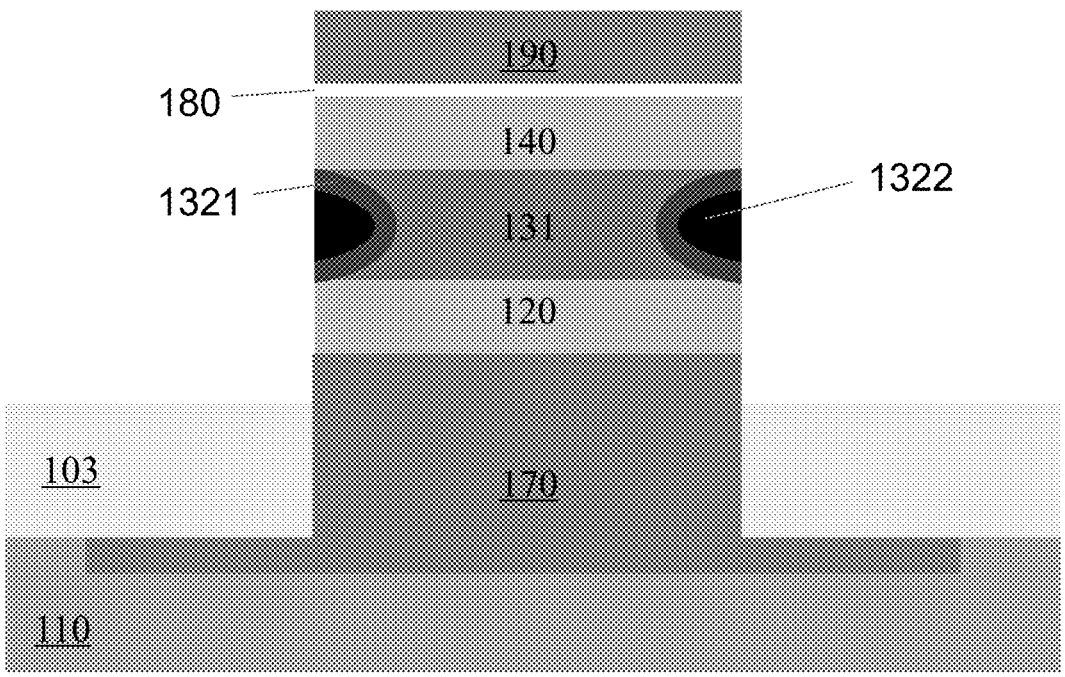

In step S103, a ferroelectric layer 1321 and a gate 1322 are sequentially formed in the C-shaped cavity 104. Reference is made to FIG. 17 and FIG. 18.

In an embodiment, the ferroelectric layer 1321 and the gate 1322 are sequentially formed in the C-shaped cavity 104, after the C-shaped cavity 104 is formed through etching. As shown in FIG. 17 and FIG. 18, the ferroelectric layer 1321 and the gate 1322 form the second region 132. The second region 132 surrounds the first region 131, and the second region 132 has a C-shaped structure. Correspondingly, the ferroelectric layer 1321 and the gate 1322 are also C-shaped. The first region 131 and the second region 132 form a functional layer 130. FIG. 17 is a cross-sectional view of a structure of a semiconductor device along a direction indicated by AA'. FIG. 18 is a cross-sectional view of a structure of a semiconductor device along a direction indicated by BB'.

The ferroelectric layer 1321 and the gate 1322 may be formed through deposition and then etching. The ferroelectric layer 1321 may be made of a ferroelectric material, such as HfZrO, that is, $Hf_xZr_{1-x}O_2$. Hence, the memory device in embodiments of the present disclosure utilizes the ferroelectric material for data storage. A thickness of the ferroelectric layer 1321 ranges from 3 nm to 30 nm. In a case that the ferroelectric layer 1321 is too thick, ferroelectric characteristics may be lost. Therefore, an appropriate thickness can improve a performance of the memory device. The gate 1322 may be made of a material having good conductivity, such as TiN, TaN, and W.

In an embodiment, the interface layer (not depicted in the figures) may further be formed in the C-shaped cavity before the ferroelectric layer 1321 and the gate 1322 are formed in the C-shaped cavity 104. The interface layer is located between the first region to improve a performance of the semiconductor device. The interface layer may be made of silicon oxide. The interface layer may be formed by oxidizing the remaining first region 131 in the semiconductor layer 101 with ozone.

In an embodiment, an isolation layer 150 is finally formed. The isolation layer 150 is located on the substrate 110 and surrounds the first electrode layer 120, the functional layer 130, and the second electrode layer 140, and to isolate and protect the device. The isolation layer 150 may be made of a dielectric material having good insulation, such as silicon oxide. Then, the first contact 161, the second contact 162, and the gate contact 163, which run through the isolation layer 150 and are electrically connected with the first electrode layer 120, the second electrode layer 140, and the gate 1322, respectively, are formed through a through-hole process. Reference is made to FIG. 2 and FIG. 4.

The embodiments of the present disclosure are described in a progressive manner, and each embodiment places emphasis on the difference from other embodiments. Therefore, one embodiment can refer to other embodiments for the same or similar parts. Since the methods disclosed in the embodiments corresponds to the devices disclosed in the embodiments, the description of the methods is simple, and reference may be made to the relevant part of the devices.

Processes or structures in the drawings are described with different emphases. A part that is not described in detail in a process or a structure may refer to relevant description for another process or another structure.

The foregoing embodiments are only some embodiments of the present disclosure. The embodiments according to the disclosure are disclosed above, and are not intended to limit the present disclosure. With the method and content disclosed above, some variations and improvements to the embodiments of the present disclosure, or make some equivalent variations on the embodiments without departing from the scope of the embodiments of the present disclosure.

On a basis of the above-described embodiments, other embodiments may be further provided according to the present disclosure by combining the foregoing embodiments.

The invention claimed is:

1. A semiconductor device, comprising:
   a substrate;
   a first electrode layer, located at a side of the substrate;
   a functional layer, located at a side of the first electrode layer away from the substrate, wherein the functional layer comprises a first region and a second region surrounding the first region, the first region is made of at least germanium, and the second region comprises a ferroelectric layer and a gate that are stacked; and
   a second electrode layer, located at a side of the functional layer away from the substrate, wherein the first electrode layer serves as one of a source layer and a drain layer, and the second electrode layer serves as another of the source layer and the drain layer;
   wherein the second region is located in a recess formed by a sidewall of the first region, the recess opens toward a direction that is parallel with the substrate and away from the first region, and an opening dimension of the recess in a direction perpendicular to the substrate gradually increases along the direction that is parallel with the substrate and away from the first region; and
   wherein the ferroelectric layer is located at an inner surface of the recess and is conformed to the inner surface, and the gate is located at a side of the ferroelectric layer away from the first region.

2. The semiconductor device according to claim 1, wherein the first region and the second region are divided by a curve in a cross section of the functional layer along a plane perpendicular to the substrate, and a thickness of the second region gradually increases along the direction that is parallel with the substrate and away from the first region.

3. The semiconductor device according to claim 1, wherein the first region is made of germanium or silicon germanium.

4. The semiconductor device according to claim 3, wherein the first region is made of the silicon germanium, and a mole fraction of germanium in the silicon germanium increases and then decreases along the direction perpendicular to the substrate.

5. The semiconductor device according to claim 4, wherein the mole fraction of germanium ranges from 10% to 70%.

6. The semiconductor device according to claim 1, wherein the ferroelectric layer is made of HfZrO, and a thickness of the ferroelectric layer ranges from 3 nm to 30 nm.

7. The semiconductor device according to claim 1, wherein:
- an isolation layer surrounding the first electrode layer, the functional layer, and the second electrode layer is located on the substrate; and
- a first contact, a second contact, and a gate contact, which run through the isolation layer, are electrically connected with the first electrode layer, the second electrode layer, and the gate, respectively.

8. A method for manufacturing a semiconductor device, comprising:
- forming a first electrode layer, a semiconductor layer made of at least germanium, and a second electrode layer at a side of a substrate in the above-listed sequence, wherein the first electrode layer serves as one of a source layer and a drain layer, and the second electrode layer serves as another of the source layer and the drain layer;
- etching the semiconductor layer from a side wall of the semiconductor layer to form a cavity, wherein the semiconductor layer remaining after the etching serves as a first region, the cavity opens toward a direction that is parallel with the substrate and away from the first region, and an opening dimension of the recess in a direction perpendicular to the substrate gradually increases along the direction that is parallel with the substrate and away from the first region; and
- forming a ferroelectric layer and then a gate in the cavity, wherein the ferroelectric layer and the gate form a second region surrounding the first region.

9. The method for according to claim 8, wherein:
- the semiconductor layer is made of silicon germanium, and a mole fraction of germanium in the silicon germanium increases and then decreases along the direction perpendicular to the substrate; and
- etching the semiconductor layer from the side wall of the semiconductor layer comprises:
- performing atomic layer etching on the semiconductor layer from the side wall to form the cavity.

10. The method according to claim 8, wherein:
- the semiconductor layer is made of germanium; and
- etching the semiconductor layer from the side wall of the semiconductor layer comprises:
- performing atomic layer etching on the semiconductor layer, with an etchant having an anisotropic etching rate for different crystal planes of the germanium, from the side wall to form the cavity.

11. The semiconductor device according to claim 1, wherein a surface, at a distal side with respect to the semiconductor device, of the gate is flush with a sidewall of the first electrode layer.

12. The method according to claim 8, wherein the ferroelectric layer is located at an inner surface of the cavity and is conformed to the inner surface, and the gate is located at a side of the ferroelectric layer away from the first region.

13. The method according to claim 8, wherein a surface, at a distal side with respect to the semiconductor device, of the gate is flush with a sidewall of the first electrode layer.

* * * * *